(12) United States Patent
Mou et al.

(10) Patent No.: US 8,746,326 B2
(45) Date of Patent: Jun. 10, 2014

(54) LIQUID HEAT-DISSIPATING MODULE

(75) Inventors: Hao Jan Mou, Hsin-Chu (TW); Ta Wei Hsueh, Hsin-Chu (TW); Ying Lun Chang, Hsin-Chu (TW); Rong Ho Yu, Hsin-Chu (TW); Shih Chang Chen, Hsin-Chu (TW)

(73) Assignee: Microjet Technology Co., Ltd., Hsin-Chu (TW)

( * ) Notice: Subject to any disclaimer, the term of this patent is extended or adjusted under 35 U.S.C. 154(b) by 640 days.

(21) Appl. No.: 13/044,126

(22) Filed: Mar. 9, 2011

(65) Prior Publication Data

US 2011/0232872 A1    Sep. 29, 2011

(30) Foreign Application Priority Data

Mar. 29, 2010  (CN) .......................... 2010 1 0157982

(51) Int. Cl.
*F28F 7/00* (2006.01)
*H05K 7/20* (2006.01)

(52) U.S. Cl.
USPC .................................. 165/80.4; 165/104.33

(58) Field of Classification Search
USPC ........... 165/80.3, 80.4, 104.33, 121; 361/698, 361/699, 703; 417/413.1
See application file for complete search history.

(56) References Cited

U.S. PATENT DOCUMENTS

| 5,427,174 | A | * | 6/1995 | Lomolino et al. ........ 165/104.13 |
| 6,019,165 | A | * | 2/2000 | Batchelder .................... 165/80.3 |
| 6,702,002 | B2 | * | 3/2004 | Wang ............................ 165/80.3 |
| 6,945,315 | B1 | * | 9/2005 | Gektin et al. ................. 165/80.4 |
| 7,431,574 | B2 | * | 10/2008 | Onishi ........................ 417/413.2 |
| 7,486,515 | B2 | * | 2/2009 | Brandenburg et al. ....... 361/703 |
| 7,694,723 | B2 |   | 4/2010 | Ma et al. |
| 2007/0000648 | A1 | * | 1/2007 | Crocker et al. .......... 165/104.33 |
| 2008/0223552 | A1 |   | 9/2008 | Onishi et al. |

FOREIGN PATENT DOCUMENTS

| TW | M252064 U | 12/2004 |
| TW | 200839495 A | 10/2008 |
| TW | 200900909 A | 1/2009 |
| TW | 201010795 A | 3/2010 |

* cited by examiner

*Primary Examiner* — Tho V Duong
(74) *Attorney, Agent, or Firm* — Muncy, Geissler, Olds & Lowe, P.C.

(57) ABSTRACT

The present invention is related to a liquid heat-dissipating module, for dissipating the heat generated by a heating element, at least comprising: a heat-absorbing unit, being connected with the heating element, for absorbing the heat generated by the heating element; a fluid delivery device, for delivering a fluid, the fluid delivery device being stacked with the heat-absorbing unit and having a heat-dissipating structure; and a connecting pipe, being connected with the heat-absorbing unit and the fluid delivery device for delivering the fluid into the heat-absorbing unit, so as to absorb the heat of the heat-absorbing unit; the fluid absorbing the heat is then delivered back to the fluid delivery device, letting the heat-dissipating structure to dissipate the heat contained in the fluid.

6 Claims, 10 Drawing Sheets

LIQUID HEAT-DISSIPATING MODULE

BACKGROUND OF THE INVENTION

1. Field of the Invention

The present invention is related to a liquid heat-dissipating module, more particularly, to a liquid heat-dissipating module with a heat-absorbing unit.

2. Description of Related Art

With the progressing of the computer industry, the issue of heat-dissipation resulting from the endless chasing of the CPU operation speed, of the multi-function of the computer, and of the miniaturization of the computer, becomes more and more severely. The issue is especially critical to the electronic device having limited interior space size, such as a laptop computer. If the heat generated by the electronic elements of the laptop computer, such as the CPU, cannot be dissipated immediately and efficiently, the operation efficiency of these electronic elements will be deteriorated. In addition, the lifetime of these electronic elements will also be shortening. Therefore, a cooling device is often adopted, for dissipating the heat of these electronic elements.

In the many techniques used for cooling, the liquid cooling method is a powerful one. A conventional liquid cooling system consists of an heat-absorber, a heat-dissipater, a pump, and a delivery pipe, wherein the delivery pipe is used as the connecting media for connecting the heat-absorber, the heat-dissipater, and the pump together, thus forming a circular loop. A cooling liquid is filled in the circular loop. The heat-absorber absorbs the generated by the electronic elements, and then the cooling liquid is delivered to the heat-absorber through the pump and the delivery pipe for absorbing the heat from the heat-absorber. Due to the suction force of the pump, the cooling liquid is further delivered to the heat-dissipater, through the delivery pipe, for dissipating the heat. With the driving of the pump, the cooling liquid circulates in the circular loop endlessly, for taking out the heat generated by the electronic elements successively.

Though the conventional liquid cooling system can achieve the goal for removing the heat generated by the electronic elements, however, the pump is only an element of the thermal transfer liquid circular loop. Besides, since the heat-absorber, heat-dissipater, and pump included in the conventional liquid cooling system are all independent elements, pipes are needed between them for connecting these independent elements together, and thus forming a circular loop. Therefore, the number of the consisting elements of the conventional liquid cooling system is too much, resulting the total volume of the fabricated conventional liquid cooling system being excessive. As a result, in the trend of the miniaturization of the electronic device, the conventional liquid cooling system is difficult to be installed in an electronic device having limited interior space size, such as laptop computer, for cooling the electronic elements therein and dissipating the heat to the exterior.

Therefore, a liquid heat-dissipating module capable of obviating the above-mentioned drawbacks of the conventional technique is required by the industry.

SUMMARY OF THE INVENTION

It is one object of the present invention to provide a liquid heat-dissipating module, capable of solving the problem of which the elements of a conventional liquid cooling system, such as a heat-absorber, a heat-dissipater, and a pump are all independent elements, and plural pipes are needed between them for connecting these independent elements together, in order to construct a circulation loop, which causes the total volume of the fabricated conventional liquid cooling system has an excessive size. Thus, the conventional cooling system is difficult to be installed in an electronic device having limited interior space size, such as laptop computer, for cooling the electronic elements therein and dissipating the heat to the exterior.

To achieve the object, the liquid heat-dissipating module according to one broader-scope preferred embodiment of the present invention, for dissipating the heat generated by a heating element, at least comprising: a heat-absorbing unit, being connected with the heating element, for absorbing the heat generated by the heating element; a fluid delivery device, for delivering a fluid, the fluid delivery device being stacked with the heat-absorbing unit and having a heat-dissipating structure; and a connecting pipe, being connected with the heat-absorbing unit and the fluid delivery device for delivering the fluid into the heat-absorbing unit, so as to absorb the heat of the heat-absorbing unit; the fluid absorbing the heat is then delivered back to the fluid delivery device, letting the heat-dissipating structure to dissipate the heat contained in the fluid.

DETAILED DESCRIPTION OF THE PREFERRED EMBODIMENT

Other objects, advantages, and typical embodiment of the present invention will be described in the following detailed description. It is to be understood that many other possible modifications and variations can be made without departing from the spirit and scope of the present invention. In addition, the following detailed description and the accompanying drawings are substantially used as an illustration, not for limiting the scope of the present invention.

Figure 1A:
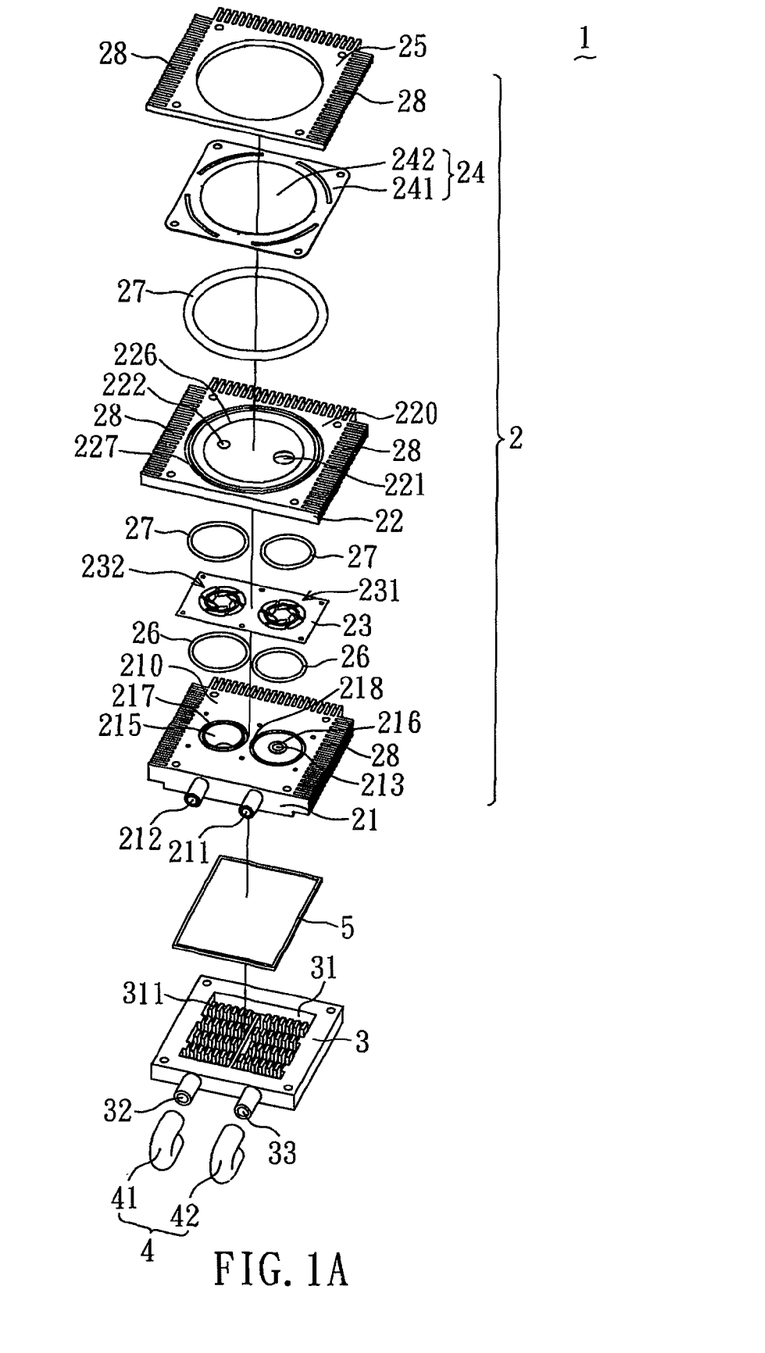
FIG. 1A is a perspective view displaying the decomposition of the structure of the liquid heat-dissipating module, according to a preferred embodiment of the present invention.

The liquid heat-dissipating module of the present invention is suitable for an electronic device, for example: the interior of a host shell of a, laptop computer, which is mainly used to dissipate the heat generated by a heating element of the host shell, for example: a CPU. Please refer to FIG. 1A, wherein FIG. 1A is a perspective view displaying the decomposition of the structure of the liquid heat-dissipating module, according to a preferred embodiment of the present invention. As shown in FIG. 1A, the liquid heat-dissipating module 1 of the present invention may comprises: a fluid delivery device 2, a heat-absorbing unit 3, and a connecting pipe 4, wherein the fluid delivery device 2 is stacked above the heat-absorbing unit 3, and they are connected with each other through the connecting pipe 4, so as to form a closed-loop between the fluid delivery device 2 and the heat-absorbing unit 3, letting a fluid flows circularly in the closed-loop and dissipate the heat contained in the fluid to the exterior through the fluid delivery device 2.

Please refer to FIG. 1A once again, the fluid delivery device 2 is mainly constructed by a valve base 21, a valve cover body 22, a valve film 23, a plurality of temporary storage rooms, an actuated device 24, a cover body 25, and a heat-dissipating structure 28, wherein a pressurized chamber 226 is formed between the valve cover body 22 and the actuated device 24. Besides, the heat-dissipating structure 28 can be a plurality of heat-dissipating fins and be disposed on the sides of the valve base 21, the valve cover body 22, and the cover body 25. The heat, which is conducted to the valve base 21, the valve cover body 22, and the cover body 25 by the fluid, can thus be dissipated to the exterior by means of natural convection or fan-forced convection.

Figure 2:
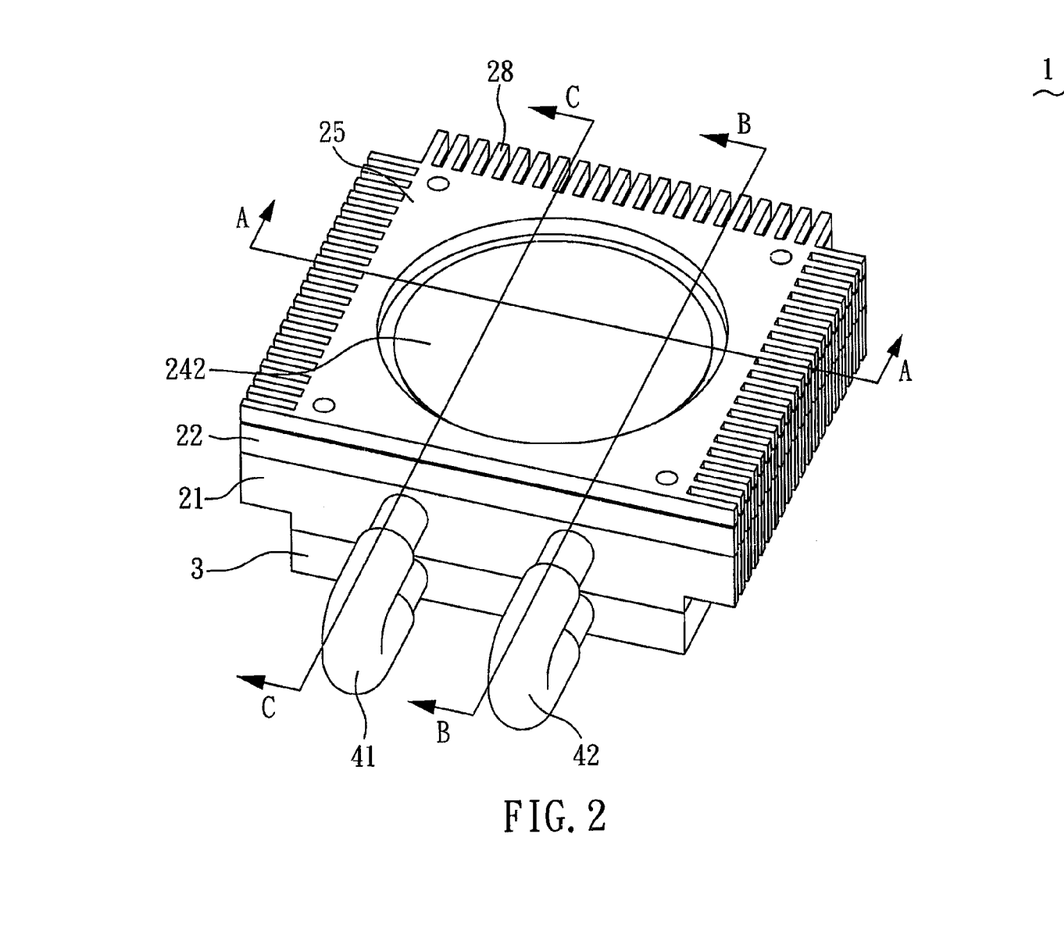
FIG. 2 is a perspective view displaying the result after the elements in FIG. 1A has been fabricated.

The method for fabricating the liquid heat-dissipating module 1 of the present invention is as follows: The valve film 23 of the fluid delivery device 2 is disposed between the valve base 21 and the valve cover body 22, and the heat-absorbing unit 3 is further disposed below the valve base 21. Thus, the valve film 23 is stacked together with the valve base 21 and the valve cover body 22, so as to form a first temporary storage room between the valve film 23 and the valve cover body 22. Another second temporary storage room is also form between the valve film 23 and the valve base 21. In addition, an actuated device 24 is installed at a corresponding position above the valve cover body 22, which is fabricated by a actuating film 241 and an actuator 242, for driving the operation of the fluid delivery device 2. At final, the cover body 25 is disposed above the actuated device 24. Thus, in the method for fabricating the liquid heat-dissipating module 1 of the present invention, the heat-absorbing unit 3, the valve base 21, the valve film 23, the valve cover body 22, the actuated device 24, and the cover body 25 are stacked sequentially. Then, the valve base 21 and the heat-absorbing unit 3 are connected with each other through the connecting pipe 4. At this time, the fabrication of the heat-dissipating module 1 is completed (as shown in FIG. 2).

Figure 3A:
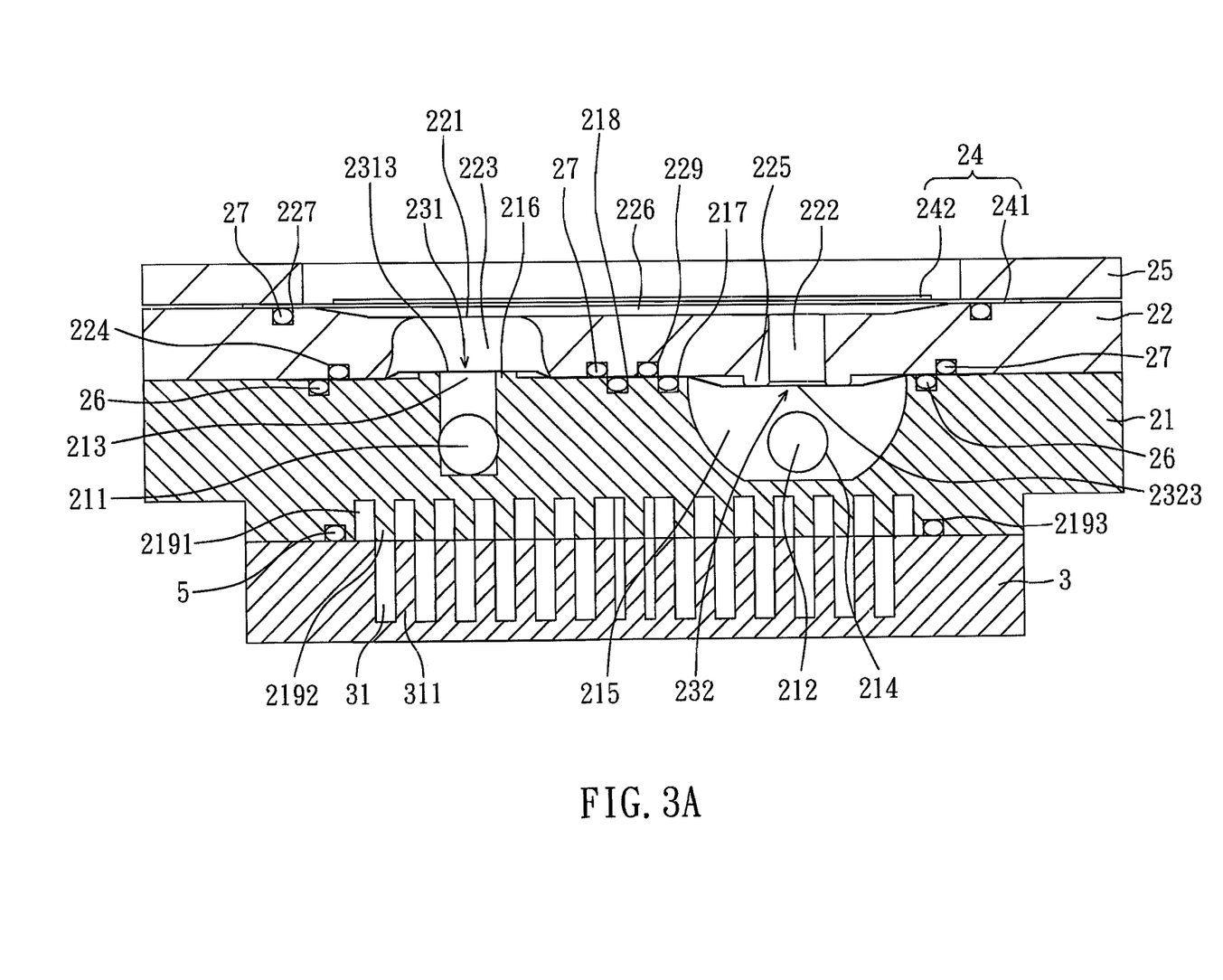
FIG. 3A is a cross-section view taken along the A-A line of FIG. 2, while the liquid heat-dissipating module is not operating.

Wherein, the valve base 21 and the valve cover body 22 are the main structures for guiding the fluid in and out in the fluid delivery device 2 of the present invention. Please refer to FIG. 1A again, the valve base 21 has a first inlet passage 211 and a first outlet passage 212, the fluid is delivered to an opening 213 of an upper surface 210 of the valve base 21 through the first inlet passage 211, and the second temporary storage room, which is formed between the valve film 23 and the valve base 21, is to be the outlet temporary storage room 215 show in the figure. However, the designation of the outlet temporary storage room is not used for limiting the scope of the present invention. The outlet temporary storage room 215 is formed by partially denting at a position of the upper surface 210 of the valve base 21, which is corresponding to the first outlet passage 212. Besides, the outlet temporary storage room 215 is connected with the first outlet passage 212 and used for storage liquid therein temporarily. The liquid is delivered to the first outlet passage 212 through the opening 214, and further to the exterior of the valve base 21 (as shown in FIG. 3). Further, the valve base 21 further includes a plurality of depression structure, for a hermetic ring 26 to be disposed thereon (as shown in FIG. 3A). The valve base 21 has a depression 218 surrounding the edge of the opening 213, and a depression 217 surrounding the edge of the outlet temporary storage room 215. The hermetic rings 26 disposed on the depression 217 and the depression 218 are mainly used to make the valve base 21 and the valve film 23 attach to each other tightly, in order to prevent the leakage of the fluid.

Figure 1B:
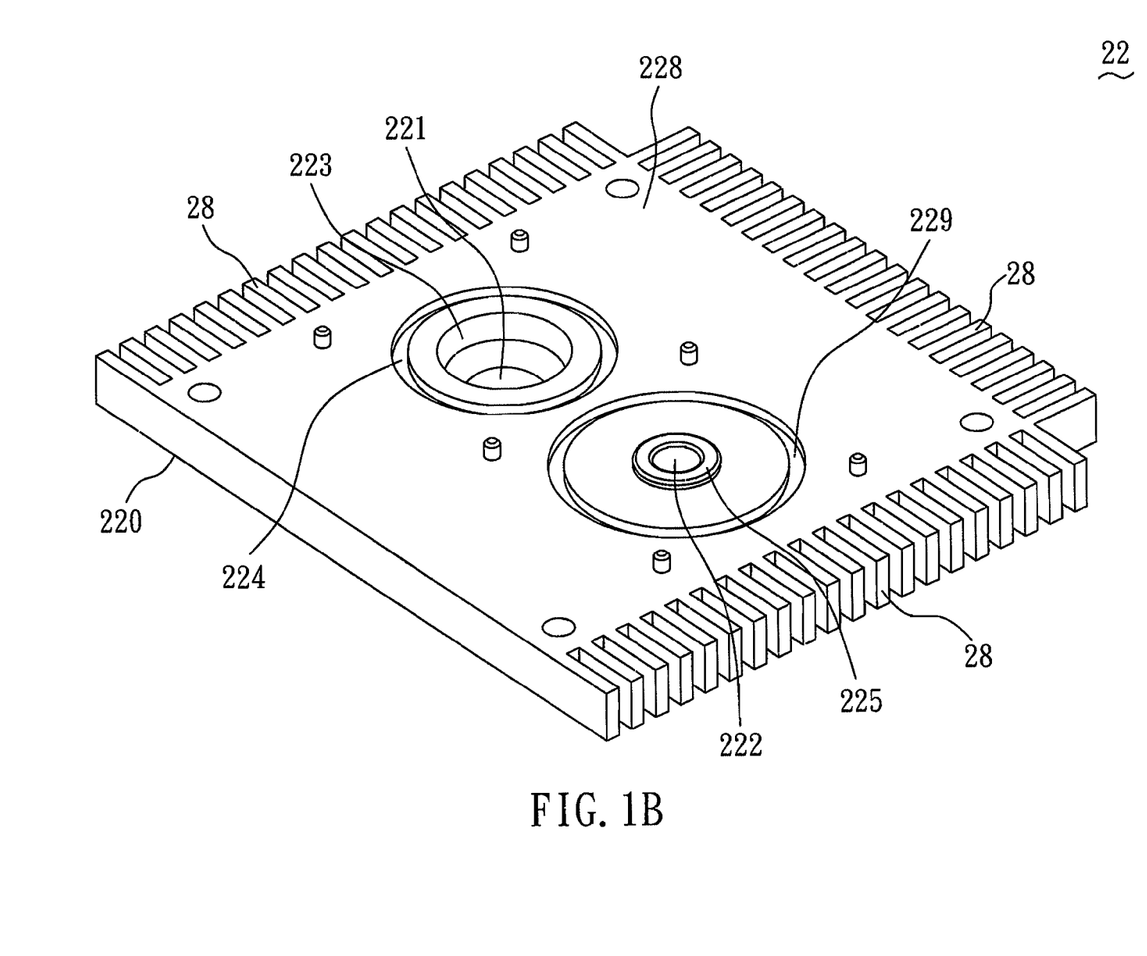
FIG. 1B is a perspective view displaying the rear-side structure of the valve cover body of FIG. 1A.

Please refer to FIG. 1B, further in view of FIG. 1A, wherein FIG. 1B is a perspective view displaying the rear-side structure of the valve cover body of FIG. 1A. As shown in FIG. 1B, the valve cover body 22 has an upper surface 220 and a lower surface 228, and an inlet valve passage 221 and an outlet valve passage 222 both penetrating the valve cover body 22 from the upper surface 220, to the lower surface 228. In addition, the inlet valve passage 221 is disposed at a position corresponding to the opening 213 of the valve base 21, while the outlet valve passage 222 is disposed at a position corresponding to the outlet temporary storage room 215 of the valve base 21. Besides, the first temporary storage room, which is formed between the valve film 23 and the valve cover body 22, is to be the inlet temporary storage room 223 shown in the figure. However, the designation of the outlet temporary storage room is not used for limiting the scope of the present invention. The inlet temporary storage room 223 is formed by partially denting at a position of the lower surface 228 of the valve cover body 22, which is corresponding to the inlet valve passage 221. Besides, the inlet temporary storage room 223 is connected with the inlet valve passage 221.

Figure 3B:
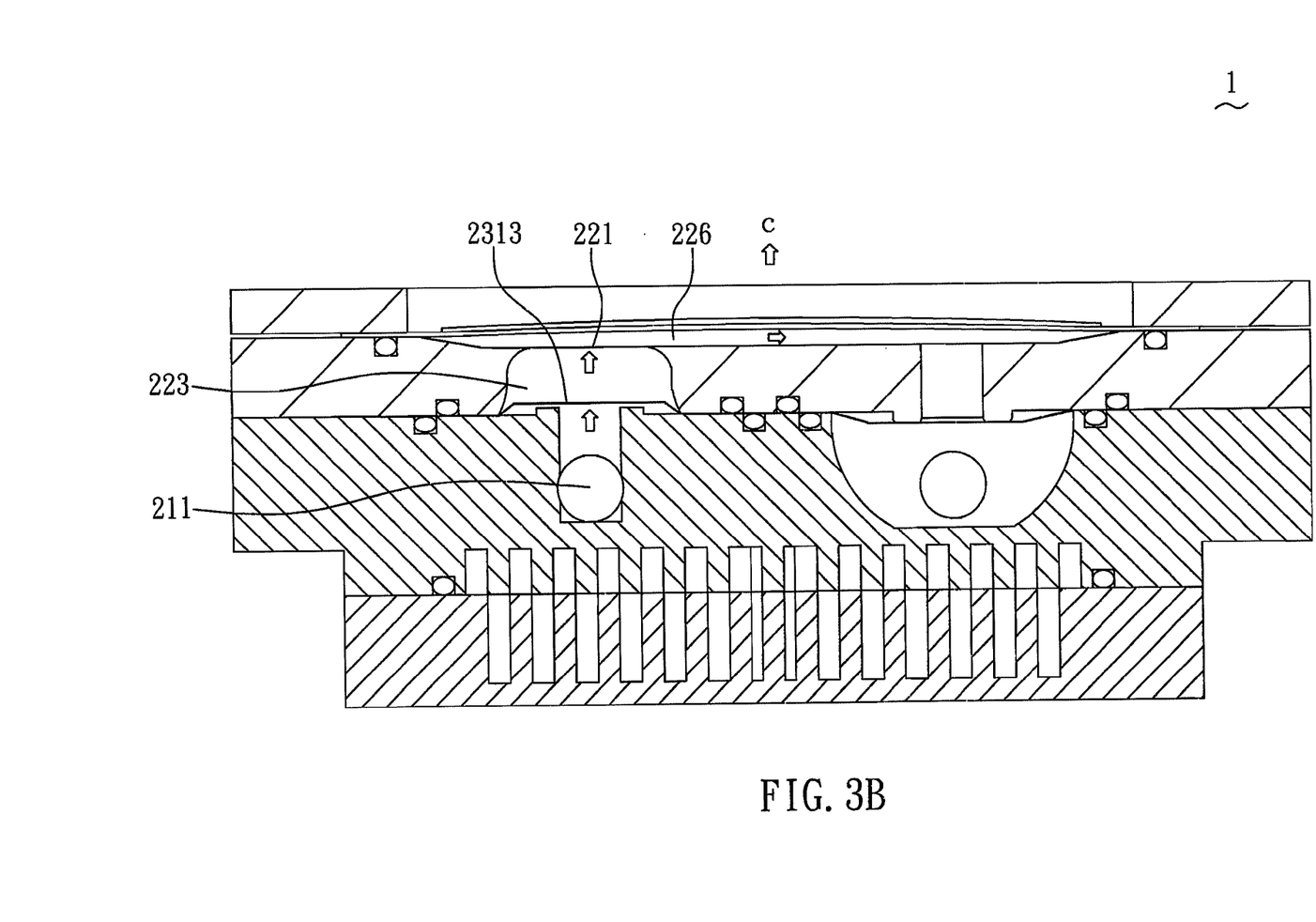
FIG. 3B is a cross-section view taken along the A-A line of FIG. 2, while the pressurized chamber is under an expanding condition.
Figure 3C:
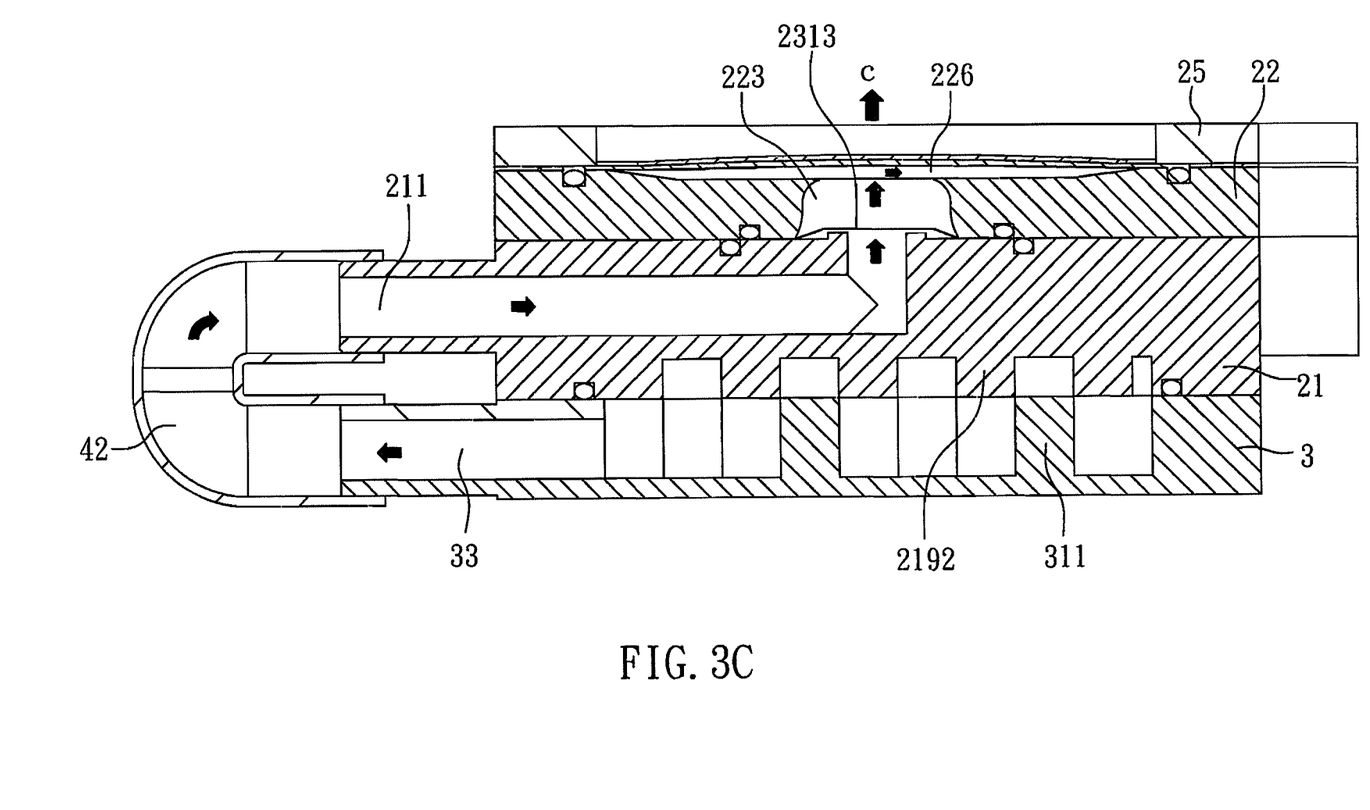
FIG. 3C is a cross-section view taken along the B-B line of FIG. 2, while the pressurized chamber is under an expanding condition.
Figure 3D:
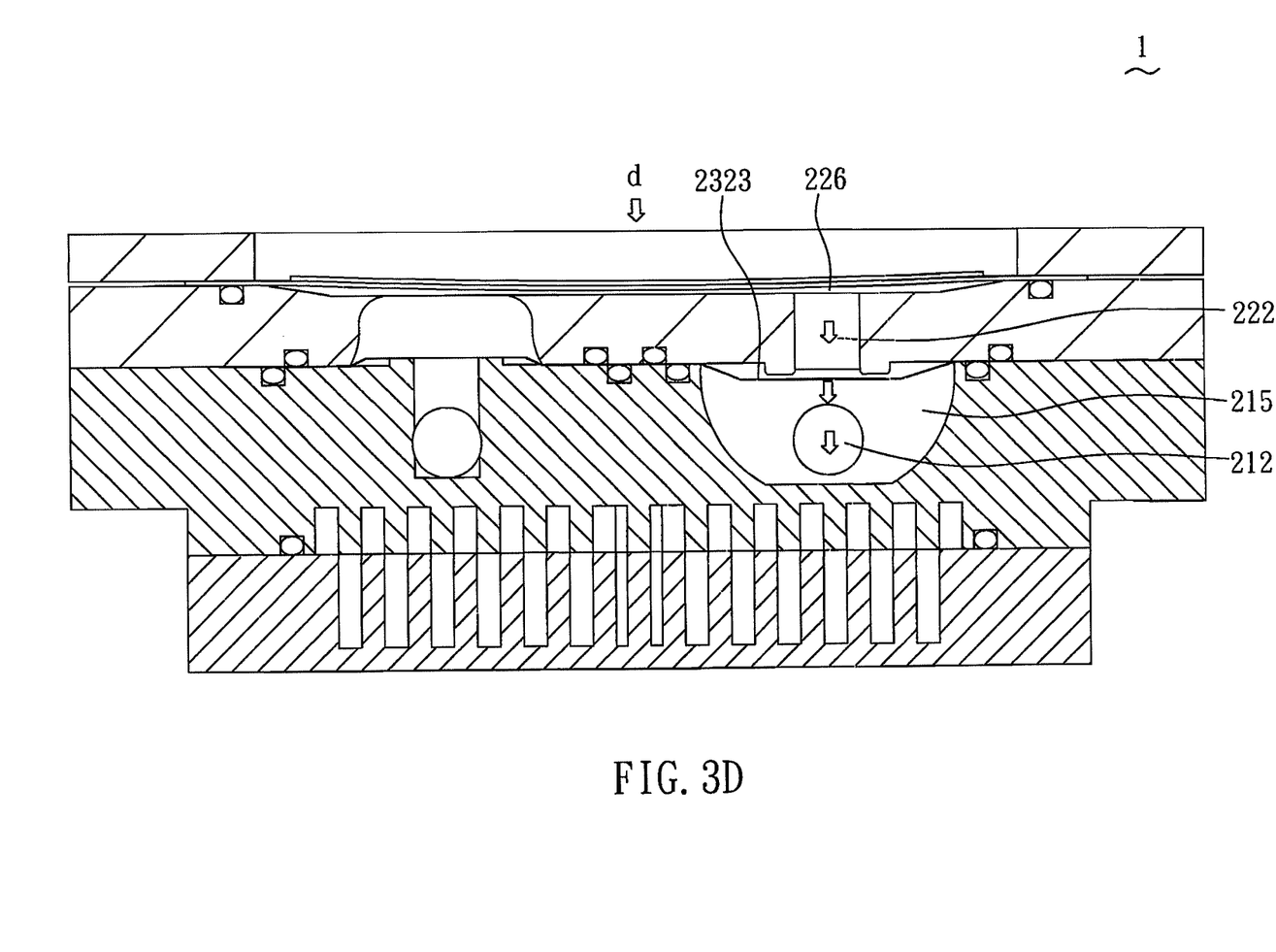
FIG. 3D is a cross-section view taken along the A-A line of FIG. 2, while the pressurized chamber is under a condensing situation.
Figure 3E:
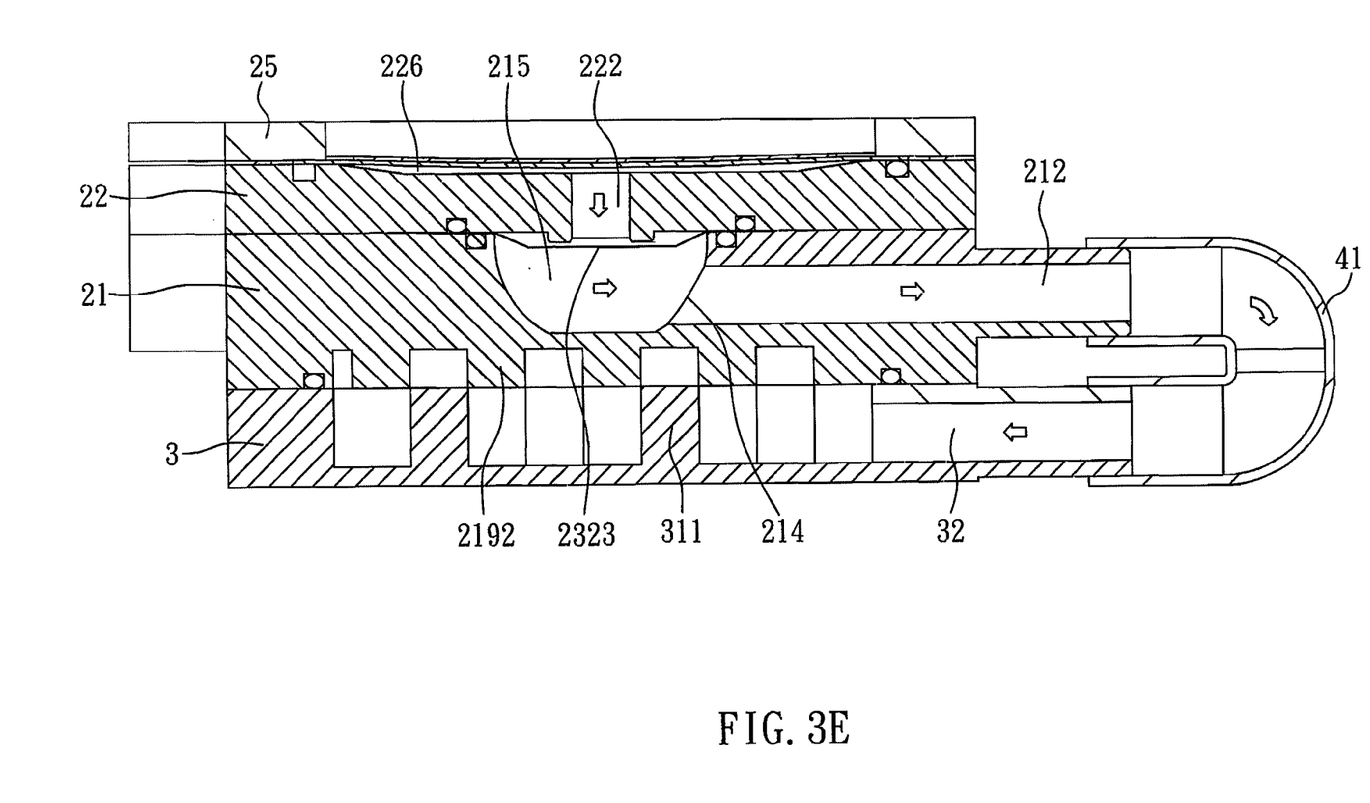
FIG. 3E is a cross-section view taken along the C-C line of FIG. 2, while the pressurized chamber is under a condensing situation.

Please refer to FIG. 1A again, the upper surface 220 of the valve cover body 22 is concave partially, to form a pressurized chamber 226, which is disposed correspondingly to the actuator 242 of the actuated device 24. The pressurized chamber 226 is connected with the inlet temporary storage room 223 through the inlet valve passage 221, and connected with the outlet valve passage 222 simultaneously. Therefore, while the actuator 242 is actuated by a voltage, the actuated device 24 is deformed, resulting in the increase of the volume of the pressurized chamber 226. Thus, a negative pressure difference is generated, which makes the fluid to flow into the interior of the pressurized chamber 226 through the inlet valve passage 221 (as shown in FIG. 3B and FIG. 3C). Later, while the direction of the electric field that applied on the actuator 242 has reversed, the actuator 242 is also deformed, resulting in the decrease of the volume of the pressurized chamber 226. Thus, a positive pressure difference is generated, which makes the fluid to flow outwardly from the pressurized chamber 226 through the outlet valve passage 222. At the mean time, some of the fluid would flow into the inlet valve passage 221 and the inlet temporary storage room 223. However, since the inlet valve structure 231 would be closed while it is under pressure (as shown in FIG. 3D and FIG. 3E), the fluid would not pass through the inlet valve plate 2313 and the backflow phenomenon can be avoided. The fluid temporarily stored inside the inlet temporary storage room 223 will flow into the pressurized chamber 226 through the inlet valve passage then, at the time when the actuator 242 is actuated by a voltage again, causing the actuated device 24 to be deformed repeatedly and resulting in the increase of the volume of the pressurized chamber 226, for delivering the fluid.

Besides, as shown in FIG. 1A and FIG. 1B, the valve cover body 22 also includes a plurality of depression structure. Taking the present embodiment as an example, the valve cover body 22 has a depression 227 surrounding pressurized chamber 226 on the upper surface 220 thereof, a depression 224 surrounding the inlet temporary storage room 223 on the lower surface 228 thereof, and a depression 229 surrounding the outlet valve passage 222 on the lower surface 228 thereof. Similarly, the above-mentioned depression structures are used for a hermetic ring 27 to be disposed thereon. The hermetic rings 27 disposed on the depression 224 and the depression 229 are mainly used to make the valve cover body 22 and the valve film 23 attach to each other tightly, in order to prevent the leakage of the fluid. In addition, the hermetic rings 27 disposed on the depression 227 is used to make the actuating film 241 of the actuated device 24 and the valve cover body 22 attach to each other tightly, in order to prevent the leakage of the fluid (as shown in FIG. 3A).

Figure 1C:
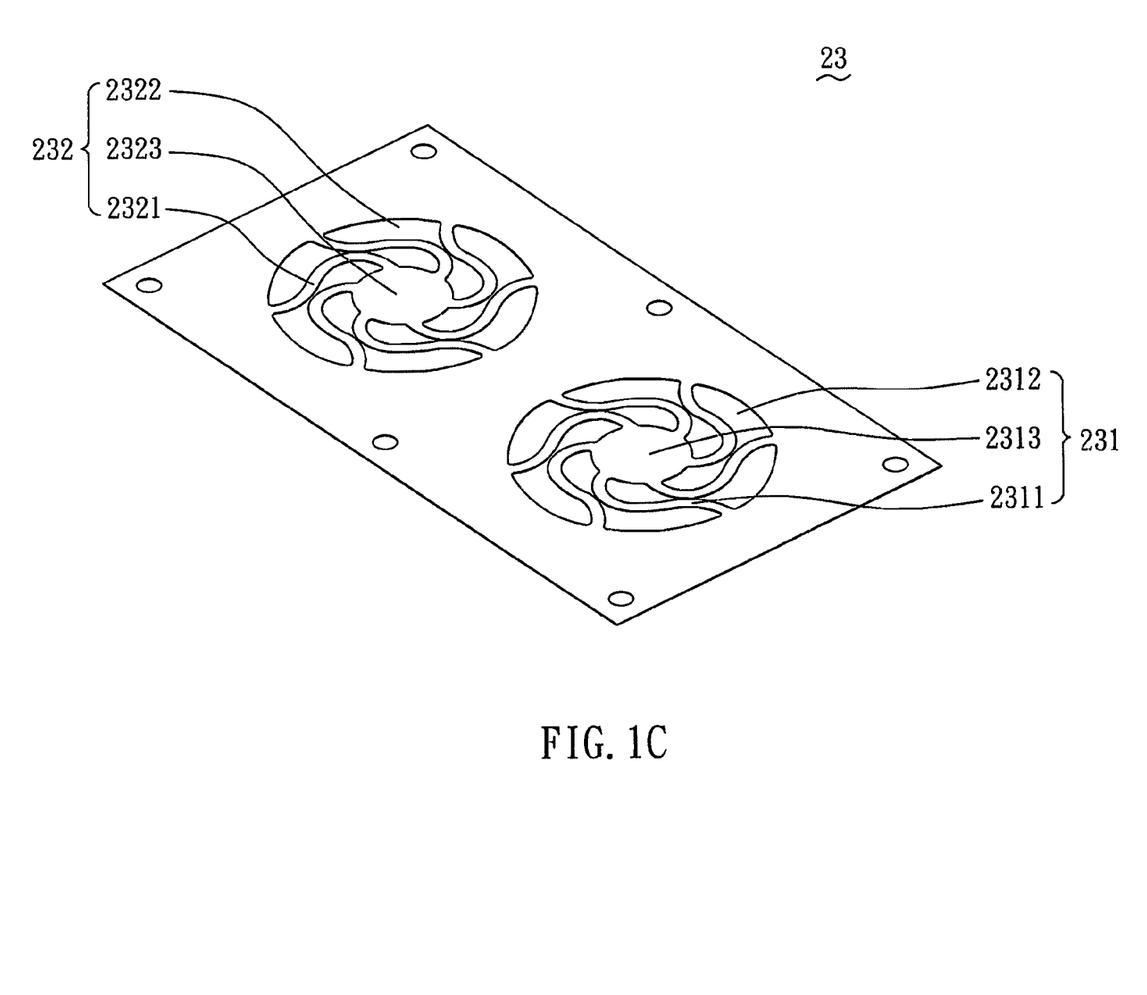
FIG. 1C is a perspective view displaying the structure of the valve film of FIG. 1A.

Please refer to FIG. 1A and FIG. 1C, wherein FIG. 1C is a perspective view displaying the structure of the valve film of FIG. 1A. The valve film 23 is mainly fabricated through the traditional fabricating process, photolithography etching, laser fabricating, electroformed fabricating, or discharge fabricating. The valve film 23 is a film structure with substantially the same thickness at all portions thereof. The valve film 23 has a plurality of hollow valve switches, including a first valve switch and a second valve switch. In the present embodiment, the first valve switch is an inlet valve structure 231, and the second valve switch is an outlet valve structure 232, wherein the inlet valve structure 231 has an inlet valve plate 2313 and a plurality of hollow openings 2312 surrounding the edge of the inlet valve plate 2313. Furthermore, an extension portion 2311 is provided between two nearby hollow openings 2312, which is connected with the inlet valve plate 2313. While the valve film 23 is under a stress transmitted from the pressurized chamber 26, as the situation shown in FIG. 3A, the whole body of the inlet valve structure 231 is attached to the valve base 21 flatly, letting the inlet valve plate 2313 attach to the micro-protrusion structure 216 firmly, resulting in the sealing of the opening 213 of the valve base 21. As a result, due to the shutting operation of the inlet valve structure 231, the fluid is unable to flow out.

Please refer to FIG. 1A again, further in view of FIG. 3A, a micro-protrusion structure 216 is disposed surrounding the edge of the opening 213 on the upper surface 210 of the valve base 21. The micro-protrusion structure 216 is disposed against to the inlet valve plate 2313 of the inlet valve structure 231, for exerting a prestress to the inlet valve structure 231. Besides, at the surface where the micro-protrusion structure 216 is in contact with the inlet valve structure 231, the micro-protrusion structure 216 contacts the inlet valve structure 231 in a horizontal contact surface manner.

Please refer to FIG. 1B again, further in view of FIG. 3A, a micro-protrusion structure 225 is disposed surrounding the edge of the outlet valve passage 222 on the lower surface 228 of the valve cover body 22. The micro-protrusion structure 225 is disposed against to the outlet valve plate 2323 of the outlet valve structure 232, for exerting a prestress to the outlet valve structure 232. Besides, at the surface where the micro-protrusion structure 225 is in contact with the outlet valve structure 232, the micro-protrusion structure 225 contacts the outlet valve structure 232 in a horizontal contact surface manner.

The above-mentioned micro-protrusion structure 216, and micro-protrusion structure 225 makes a gap to be formed, respectively between the valve film 23 and the valve base 21 and between the valve film 23 and the valve cover body 22. Besides, since these two micro-protrusion structures exert prestress to the inlet valve structure 231 and the outlet valve structure 232, respectively, the inlet valve structure 231 and the outlet valve structure 232 are easily to be opened.

While the valve film 23 is under the suction force caused by the increase of the volume of the pressurized chamber 226, as a prestress is exerted on the inlet valve structure 231 by the micro-protrusion structure 216 of the valve base 21, a stronger pre-tightly-covered effect is generated with the support of the extension portion 2311, for preventing the backflow phenomenon from happening. When the inlet valve structure 231 is displaced due to the negative pressure difference of the pressurized chamber 226 (as shown in FIG. 3B and FIG. 3C), the fluid flows into the inlet temporary storage room 223 of the valve cover body 22 through the hollow opening 2312. The fluid is further delivered into the pressurized chamber 226 through the inlet temporary storage room 223 and the inlet valve passage 221. Therefore, the inlet valve structure 231 can be opened or closed rapidly in response to the positive pressure difference or the negative pressure difference of the pressurized chamber 226, for controlling the flowing in/flowing out behavior of the fluid, and preventing the backflow of the fluid to the valve base 21.

Similarly, the other valve structure on the same valve film 23 is the outlet valve structure 232. However, as the operation involving the outlet valve plate 2323, the extension portion 2321, and the opening 2322 are all the same with those of the inlet valve structure 231, detailed description on the operation of these elements of the outlet valve structure 232 is omitted hereinafter. However, the orientation direction of the micro-protrusion structure 225 against to the outlet valve structure 232 is opposite to the orientation direction of the micro-protrusion structure 216 against to the inlet valve structure 231, as shown in FIG. 3D. Therefore, while the pressurized chamber 226 is compressed to generate a thrust force, the micro-protrusion structure 225 disposed on the lower surface 228 of the valve cover body 22 exerts a prestress to the outlet valve structure 232, a stronger pre-tightly-covered effect is generated with the support of the extension portion 2321, for preventing the backflow phenomenon from happening. When the outlet valve structure 232 is displaced due to the positive pressure difference of the pressurized chamber 226, the fluid flows into the outlet temporary storage room 215 of the valve base 21 through the hollow opening 2322. The fluid is further delivered outwardly through the opening 214 and the first outlet passage 212. Therefore, with the operation of the outlet valve structure 232, the fluid can be delivered outwardly from the pressurized chamber 226, for delivering the fluid.

Figure 1D:
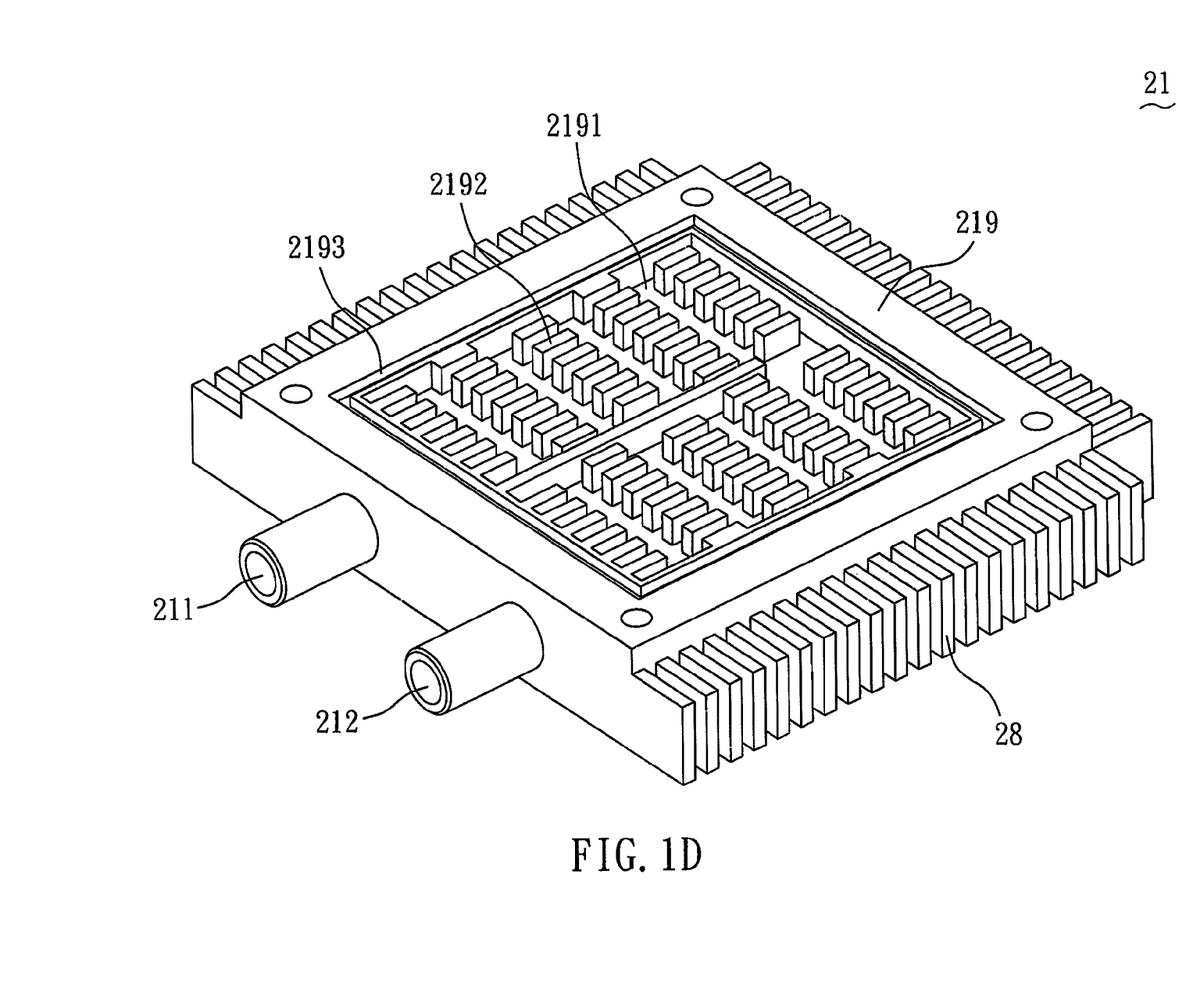
FIG. 1D is a perspective view displaying the rear-side structure of the valve base of FIG. 1A.

Please refer to FIG. 1D further in view of FIG. 1A, wherein FIG. 1D is a perspective view displaying the rear-side structure of the valve base of FIG. 1A. As shown in the figure, the valve base 21 includes a first containing tank 2191 on the lower surface 219 thereof. A plurality of first protrusion structure 2192 is formed inside the interior of the first containing tank 2191, and the plurality of first protrusion structure 2192 is arranged in an interlaced array. Besides, the plurality of first protrusion structure 2192 is used to absorb the heat of the heat-absorbing unit. In addition, the valve base 21 further includes a depression 2193 surrounding the edge of the first containing tank 2191 on the lower surface 219, which is used for a rectangular hermetic ring 5 to be disposed thereon (as shown in FIG. 1A). As a result, the heat-absorbing unit 3 and the valve base can attach to each other tightly, for preventing the leakage of the fluid.

Please refer to FIG. 1A again, the bottom of the heat-absorbing unit 3 of the present invention is in contact with a heating element directly or attached with the heating element by a heat-dissipating glue, for absorbing the heat generated by the heating element. The heat-absorbing unit 3 has a second containing tank 31, a second inlet passage 32 and a second outlet passage 33, wherein the second containing tank 31 corresponds to the first containing tank 2191 of the valve base 21, and a plurality of second protrusion structure 311 is formed inside the interior of the second containing tank 31 and arranged in interlaced array. In addition, the first protrusion structure 2192 of the first containing tank 2191 and the second protrusion structure 311 of the heat-absorbing unit 3 are staggeredly arranged (as shown in FIG. 3A), for increasing the heat-conductive efficiency. The plurality of the second protrusion structure 311 is mainly used to conduct the heat, which heat-absorbing unit absorbs from the heating element, to the fluid.

Please refer to FIG. 3E, wherein FIG. 3E is a cross-section view taken along the C-C line of FIG. 2, while the pressurized chamber is under a condensing situation. As shown in the figure, the first outlet passage 212 of the valve base 21 is connected with the second inlet passage 32 of the heat-absorbing unit 3, through the first connecting pipe 41. Thus, the fluid can be delivered to the interior of the heat-absorbing unit 3, from the fluid delivery device 2, letting the fluid to absorb the heat of the heat-absorbing unit 3. Please refer to FIG. 3C, wherein FIG. 3C is a cross-section view taken along the B-B line of FIG. 2, while the pressurized chamber is under an expanding condition. As shown in the figure, the first inlet passage 211 of the valve base 21 is connected with the second outlet passage 33 of the heat-absorbing unit 3, through the second connecting pipe 42. Thus, the fluid contained the heat is delivered to the fluid delivery device 2. With the successive circulation of the fluid, the heat is conducted to the heat-dissipating structure 28, through the valve base 21, the valve cover body 22, and the cover body 25, and further is dissipated to the exterior by means of natural convection or fan-forced convection.

Please refer to FIG. 3A, wherein FIG. 3A is a cross-section view taken along the A-A line of FIG. 2, while the liquid heat-dissipating module is not operating. In the present embodiment, the micro-protrusion structure 216 disposed surrounding the edge of the opening 213 of the valve base 21, letting the inlet valve plate 2313 of the inlet valve structure 231, which is attached to the valve base 21, is in a form of upward bumping, for the micro-protrusion structure 216 disposed against it. The rest part of the valve film 23 is against to the valve cover body 22. As a result, the micro-protrusion structure 216 exerts a prestress to the inlet valve structure 231, which is helpful to generate a stronger pre-tightly-covered effect, for preventing the backflow phenomenon from happening. Moreover, as the horizontal contact surface of the micro-protrusion structure 216 is located at the inlet valve structure 231 of the valve film 23, a gap is formed between the inlet valve plate 2313 and the valve base 21 while the inlet valve structure 231 is not operating. Similarly, the micro-protrusion structure 225 disposed surrounding the edge of the outlet valve passage 222 can let the outlet valve plate 2323 of the outlet valve structure 232 of the valve film 23 to protrude downwardly. In addition, as the only difference between the micro-protrusion structure 225 and the micro-protrusion structure 216 is their disposing directions, which are opposite to each other, the function of the micro-protrusion structure 225 will be omitted hereinafter.

Please refer to FIG. 3A, FIG. 3B, and FIG. 3C simultaneously, as shown in these figures, after the cover body 25, the actuated device 24, the valve cover body 22, the valve film 23, the hermetic ring 26, 27, the valve base 21, hermetic ring 5, and the heat-absorbing unit 3 being fabricated correspondingly, and the valve base 21 and the heat-absorbing unit 3 being connected with each other through the first connecting pipe 41 and the second connection pipe 42, the opening 213 of the valve base 21 is disposed correspondingly both to the inlet valve structure 231 of the valve film 23 and the inlet valve passage 221 of the valve cover body 22. In addition, the outlet temporary storage room 215 of the valve base 21 is disposed correspondingly both to the outlet valve structure 232 of the valve film 23 and the outlet valve passage 222 of the valve cover body 22. Moreover, since the micro-protrusion structure 216 is disposed surrounding the edge of the opening 213 of the valve base 21, the inlet valve structure 231 of the valve film 23 protrudes slightly above the valve base 21. In addition, a prestress is generated by the contacts of the micro-protrusion structure 216 to the valve film 23, letting a gap to be formed between the inlet valve structure 231 and the valve base 21 while the inlet valve structure 231 is not operating. Similarly, another gap is formed between the outlet valve structure 232 and the valve cover body 22, by means of disposing the micro-protrusion structure 225 on the valve cover body 22.

While the actuator 242 is actuated by a voltage, the actuated device 24 is deformed in a bent form, as shown in FIG. 3B and FIG. 3C. The actuated device 24 bents toward the direction indicated by the arrow c of the figures, resulting in the increase of the volume of the pressurized chamber 226, causing a suction force. The inlet valve structure 231 and the outlet valve structure 232 of the valve film 23 suffers the upward suction force, making the inlet valve plate 2313 of the inlet valve structure 231, which has already been exerted a prestress thereon, to open rapidly. In this manner, the fluid contained the heat absorbed from the heat-absorbing unit 3, can be sucked from the heat-absorbing unit 3 through the second outlet passage 33, the second connecting pipe 42 and the first inlet valve passage 221 of the valve base 21 (as shown in FIG. 3C). Then, the fluid continuously flows through the opening 213 of the valve base 21, the opening 2312 of the inlet valve structure 231 of the valve film 23, the inlet temporary storage room 223 of the valve cover body 22, and the inlet valve passage 221, into the pressurized chamber 226 (as shown in FIG. 3B and FIG. 3C).

Meanwhile, please refer to FIG. 3B again, since the inlet valve structure 231 and the outlet valve structure 232 of the valve film 23 both suffer the upward suction force, the outlet valve plate 2323 located above the valve film 23 seals the outlet valve passage 222, thus shutting the outlet valve structure 232. Furthermore, as the micro-protrusion structure 225 contacts the outlet valve structure 232 in a horizontal contact surface manner, the outlet valve structure 232 of the valve film 23 can still be in contact with the micro-protrusion structure 225 in the manner of a sealing surface, even when the fluid flows into the interior of the valve base 21 as the inlet valve structure 231 being opened. Therefore, a much stronger pre-tightly-covered effect is generated, for preventing the backflow phenomenon from happening.

While the actuated device 24 is deformed to bent downwardly toward the direction indicated by the arrow d of FIG. 3D, due to the change of the electric field, the volume of the pressurized chamber 226 is compressed. Thus, a thrust force is generated by the pressurized chamber 226, which exerts on the fluid therein. Therefore, the inlet valve structure 231 and the outlet valve structure 232 of the valve film 23 both suffer the downward thrust force. At the mean time, the outlet valve plate 2323 of the outlet valve structure 232, which is located above the micro-protrusion structure 225, could be opened rapidly (as shown in FIG. 3D and FIG. 3E), for draining the fluid almost instantaneously. The fluid flows from the pressurized chamber 226, through the outlet valve passage 222 of valve cover body 22, the opening 2322 of the outlet valve structure 232 of the valve film 23, the outlet temporary storage chamber 215 of the valve base 21, the opening 214 and the first outlet passage 212. Then, the fluid continuously flows through the first connecting pipe 41 and the second inlet passage 32 of the heat-absorbing unit 3, into the second containing tank 31 of the heat-absorbing unit 3 (as shown in FIG. 3E). Thus, the fluid can absorb the heat from the heat-absorbing unit 3, which is previously absorbed from the heating element.

Similarly, since the inlet valve structure 231 suffers the downward thrust force, the inlet valve plate 2313 seals the opening 213, thus shutting the inlet valve structure 231. Furthermore, as the micro-protrusion structure 216 contacts the inlet valve structure 231 in a horizontal contact surface manner, the inlet valve structure 231 of the valve film 23 can still be in contact with the micro-protrusion structure 216 in the manner of a sealing surface, even when the fluid flows outwardly as the outlet valve structure 232 being opened. Therefore, a much stronger pre-tightly-covered effect is generated, for preventing the backflow phenomenon from happening. As a result, by means of disposing the inlet valve structure 231 and the outlet valve structure 232, which are corresponding to the micro-protrusion structure 216 of the valve base 21 and the micro-protrusion structure 225 of the valve cover body 22, respectively, the backflow phenomenon will not happen during the delivery process of the fluid, achieving a high efficiency fluid delivery.

In the present embodiment, the fluid delivery device 2 is constructed by the material, which has a good heat-conduction. The material can be metal having good heat dissipation ability, such as copper or aluminum alloys.

The fluid flows circularly in the closed-loop of the fluid heat-dissipating module 1 of the present invention, in response to the operation of the actuated device 24. When the volume of the pressurized chamber 226 is compressed, the fluid flows into the second containing tank 31, through the first outlet passage 212 of the valve base 21, the first connecting pipe 41 and the second inlet passage 32 of the heat-absorbing unit 3 (as shown in FIG. 3E). Thus, the fluid can absorb the heat from the heat-absorbing unit 3, which is previously absorbed from the heating element. On the contrary, when the volume of the pressurized chamber 226 is increasing, the fluid already absorbed the heat from the heat-absorbing unit 3 could be sucked into the interior of the fluid delivery device 2, through the second outlet passage 33 of the heat-absorbing unit 3, the second connecting pipe 42 and the first inlet passage 211 of the valve base 21, for being circulated (as shown in FIG. 3C). Besides, the heat contained in the fluid is conducted to the heat-dissipating structure 28, through the valve base 21, the valve cover body 22, and the cover body 25, and further be dissipated to the exterior by means of natural convection or fan-forced convection.

In summary, the liquid heat-dissipating module of the present invention is constructed by stacking the fluid delivery device and the heat-absorbing unit together, wherein these two elements are connected with each other by the use of the connecting pipes. In this manner, a closed-loop is formed, where the fluid is delivered to the heat-absorbing unit to absorb the heat of the heat-absorbing unit, and the fluid then flows back to the fluid delivery device, for dissipating the heat contained in the fluid by the heat-dissipating structure. As a result, in addition to be able to dissipate the heat of a heating element, the total volume of the liquid heat-dissipating module after it is fabricated is also limited, capable of being installed in an electronic device having limited interior space size, such as laptop computer.

Although the present invention has been explained in relation to its preferred embodiments, it is to be understood that many other possible modifications and variations can be made without departing from the scope of the invention as hereinafter claimed.

What is claimed is:

1. A liquid heat-dissipating module, to dissipate the heat generated by a heating element, at least comprising:
a heat-absorbing unit, being connected with the heating element, for absorbing the heat generated by the heating element;
a fluid delivery device, for delivering a fluid, the fluid delivery device being stacked with the heat-absorbing unit and composed of a good heat-conductive material, wherein the fluid delivery device at least comprises:
a heat-dissipating structure;
a cover body;
a valve base having a first outlet passage and a first inlet passage;
a valve cover body, disposed on the valve base;
a valve film, located between the valve base and the valve cover body;
a plurality of temporary storage rooms, disposed between the valve film and the valve cover body, and between the valve film and the valve base; and
an actuating device, having a side edge fixed firmly to the valve cover body; and
a connecting pipe, being connected with the heat-absorbing unit and the fluid delivery device for delivering the fluid into the heat-absorbing unit, so as to absorb the heat of the heat-absorbing unit; the fluid absorbing the heat is then delivered back to the fluid delivery device, letting the heat-dissipating structure to dissipate the heat contained in the fluid.

2. The liquid heat-dissipating module as claimed in claim 1, wherein the valve base further includes a first containing tank, a plurality of first protrusion structure is formed inside the interior of the first containing tank, and arranged in an interlaced array, the plurality of first protrusion structure is used to absorb the heat of the heat-absorbing unit.

3. The liquid heat-dissipating module as claimed in claim 2, wherein the heat-absorbing unit has a second containing tank, a second inlet passage, and a second outlet passage; the second containing tank corresponds to the first containing tank, and a plurality of second protrusion structure is formed inside the interior of the second containing tank, and arranged in an interlaced array; the first protrusion structure and the second protrusion structure are staggeredly arranged, and the plurality of second protrusion structure transmits the heat absorbed by the heat-absorbing unit to the fluid.

4. The liquid heat-dissipating module as claimed in claim 3, wherein the first outlet passage of the valve base connects with the second inlet passage of the heat-absorbing unit through the connecting pipe, and the first inlet passage of the valve base connects with the second outlet passage of the heat-absorbing unit through the connecting pipe, so as to form a close-loop between the fluid delivery device and the heat-absorbing unit.

5. The liquid heat-dissipating module as claimed in claim 1, wherein the heat-dissipating structure is a plurality of heat-dissipating fins, the plurality of heat-dissipating fins is disposed to the sides of the valve base, the valve cover body and the cover body, of the fluid delivery device.

6. The liquid heat-dissipating module as claimed in claim 5, wherein the fluid flows circularly in the close-loop due to the actuation of the actuated device, for transmitting the heat absorbed by the heat-absorbing unit to the plurality of heat-dissipating fins through the valve base, the valve cover body and the cover body of the fluid delivery device, and the heat is dissipated through convection.

* * * * *